United States Patent [19]

Nicklaus

[11] Patent Number: 5,550,402
[45] Date of Patent: Aug. 27, 1996

[54] ELECTRONIC MODULE OF EXTRA-THIN CONSTRUCTION

[75] Inventor: Karl Nicklaus, Cham, Switzerland

[73] Assignee: Esec Sempac S.A., Cham, Switzerland

[21] Appl. No.: 156,295

[22] Filed: Nov. 23, 1993

[30] Foreign Application Priority Data

Nov. 27, 1992 [CH] Switzerland ............ 03633/92

[51] Int. Cl.$^6$ ............................................. H01L 23/495
[52] U.S. Cl. ........................ 257/669; 257/676; 257/684
[58] Field of Search ........................ 257/666, 666.3, 257/676, 669, 684, 678

[56] References Cited

U.S. PATENT DOCUMENTS

| 4,937,656 | 6/1990 | Kohara | 257/676 |
| 5,126,823 | 6/1992 | Otsuka et al. | 257/666 |
| 5,134,773 | 8/1992 | LeMaire et al. | 29/827 |

FOREIGN PATENT DOCUMENTS

| 0197438 | 3/1986 | European Pat. Off. . | |
| 0211716 | 7/1986 | European Pat. Off. . | |
| 0391790 | 4/1990 | European Pat. Off. . | |
| 3809005 | 9/1989 | Germany . | |
| 60-171733 | 9/1985 | Japan | 257/676 |
| 61-234129 | 4/1986 | Japan . | |
| 1-270338 | 10/1989 | Japan . | |
| 254957 | 2/1990 | Japan | 257/666.3 |
| 1-44658 | 11/1990 | Japan . | |
| 3-73560 | 3/1991 | Japan . | |
| 1383297 | 2/1975 | United Kingdom | 257/666 |
| 2149209 | 6/1985 | United Kingdom . | |
| WO91/01533 | 2/1991 | WIPO . | |

Primary Examiner—Jerome Jackson, Jr.
Assistant Examiner—Nathan K. Kelley
Attorney, Agent, or Firm—McCormick, Paulding & Huber

[57] ABSTRACT

In the electronic module (M) of extra-thin construction disclosed, it is the principal object to substantially reduce the tendency to fracture of the module's semiconductor chip embedded in the plastic casing of the module (M), notwithstanding the extremely small thickness of the casing. The chip is fitted on the chip pad of a system support formed by a thin metal strip, commonly known as a lead frame. The chip may partly overlap the external contacts of the module that lie on one of the flat sides of the module's plastic casing. Slits in the system support, which form the boundaries of the chip pad and are inevitable lines of weakness in the thin metal strip, are situated at an oblique angle relative to the edges of the square or rectangular chip, preferably at about 45°; hence the slits extend also at an oblique angle to possible fracture lines within the monocrystalline structure of the material used in chip manufacture, because said fracture lines are parallel to the chip's edges. Other slits in the metal strip, which extend from said boundary slits, should preferably also be at an angle relative to the edges of the chip. Further characteristics disclosed relate to the mechanical bond between parts of the system support and the module casing, and the bonding of the entire module (M) to the surrounding plastic material when it is moulded into a supporting body or medium, for example in the manufacture of chip cards.

20 Claims, 8 Drawing Sheets

ELECTRONIC MODULE OF EXTRA-THIN CONSTRUCTION

BACKGROUND OF THE INVENTION

The present invention relates to an electronic module of extra-thin construction, having external contacts which lie in a plane on one of the flat sides of a plastic casing and which are made out of a system support (lead frame) formed of a thin, flat metal-strip structure, and having a semiconductor chip mounted on one side of the system support on a chip pad thereof, said chip being moulded within the plastic material of the casing and electrically connected to the external contacts.

PRIOR ART

An electronic module of this type is known, for example, from U.S. Pat. No. 5,134,773, which describes a process that permits the manufacture of so-called chip cards by direct moulding of the module into the plastic material that forms the card, whereby the external contacts lie exposed and flush on one of the flat sides of the card. A special advantage of such an electronic module is that its external contacts and the chip pad are made of a system support in the form of a so-called lead frame, i.e. a thin, flat metal strip, the shape or outlines of which are usually punched or diestamped. This permits the efficient, economic manufacture of the modules by established and wellknown procedures and by means of automated assembly equipment such as is generally used in the assembly of semiconductor devices or integrated circuits such as microprocessors etc.

However, extremely thin, flat electronic modules set special problems as regards strength and functional performance in use. By contrast with widely used design types, where the system support (lead frame) and semiconductor chip are covered on both flat sides by the plastic material of the casing, i.e. embedded in a casing of sufficient thickness (such as that commonly known as a DIP casing for assembly on circuit boards), in the present case the total height or thickness available for the module is very limited. The typical thickness of chip cards is only about 0.8 mm, and similar limitations of module thickness apply to other uses of modules of flat casing, such as electronic keys. A further difficulty is that the mechanical fixation of the electronic module in such objects must be very durable, yet it is also subject to considerable mechanical stresses, especially bending and compression, and sometimes to sudden changes of temperature. These stresses act either directly upon the module from outside, or are induced within it by the object by way of the aforesaid means of fixation.

Because the plastic layer of the casing is so thin, extra-thin, flat modules of this kind not only create certain difficulties in manufacture by injection moulding, but there is above all a high risk of fracture of the embedded semiconductor chip; clearly, this risk is just as serious while the module is being manufactured, moulded, tested, handled, etc., as later when the card or other object is in use.

In the type of module mentioned above, the casing in the form of a thin layer or "disc" of plastic is bonded to the system support at only one side thereof. The metal parts of the system support itself thus contribute substantially to the module's strength. In this, a good bond between the metal parts and the plastic material is obviously of particular importance. But at the same time the thin metal structure is weakened in itself by the slit-shaped punchings in the metal that form the boundaries of the chip pad and separate the external contacts from one another. In prior art, e.g. according to U.S. Pat. No. 5,134,773, mainly because of this risk of fracture, the area of the chip is therefore limited to the area of the chip pad.

SUMMARY OF THE INVENTION

The present invention proposes a particular design of electronic module of the aforesaid type, with the principal object of meeting the special requirements of extremely thin, flat construction, while at the same time preserving or making even better use of the technical and economic advantages of chip assembly on sheet-metal system supports, so-called lead frames. A particular object is to achieve a generally stronger type of construction as regards resistance to bending and compression stresses, and to use to the maximum the total thickness available for the module.

These and other objects are achieved by having at least those slits in the system support, which form the boundaries of the chip pad and separate it from the external contacts, oriented at an oblique angle relative to the edges of the square or rectangular chip, said angle being preferably about 45°. Such arrangement is based on the fact that—because of the alignment or orientation of the monocrystalline structures in the material (typically silicon) used in the manufacture of the semiconductor chips—the "preferred" or most probable lines of fracture are always parallel to the edges of the chip. If the lines of weakness formed in the system support by the said slits are at an angle to the edges of the chip and thus to the orientation of the monocrystalline structure, the chip's tendency to fracture can be significantly reduced. The practical effect of this applies only to thin, flat designs that make use of a thin sheet metal system support, inasmuch such a support contributes to the overall strength of the module.

Other practical embodiments of the electronic module according to the invention. contribute to further reducing the risk of fracture; in addition, they also permit the use of larger chips that project beyond the chip pad. Still other features of the invention offer particular advantages in the embedding of the module (by means of injection moulding) in a thin, flat plastic object (e.g. a chip card, electronic key and the like) with regard to the fixation of the module and for centering it in the mould. A thin, flat plastic object comprising an electronic module is made in accordance with the present invention, which allows full use to be made in the module of the object's available structural height or thickness. Further features of the electronic module are relevant to its interaction with automated assembly equipment, for example in the fitting of components on circuit boards by the SMD technique (SMD=surface-mounted device).

Typical embodiments of the subject of the present invention are described below in greater detail, by reference to and in conjunction with the drawings, as follows.

BRIEF DESCRIPTION OF DRAWINGS

DETAILED DESCRIPTION OF INVENTION

Figure 1:
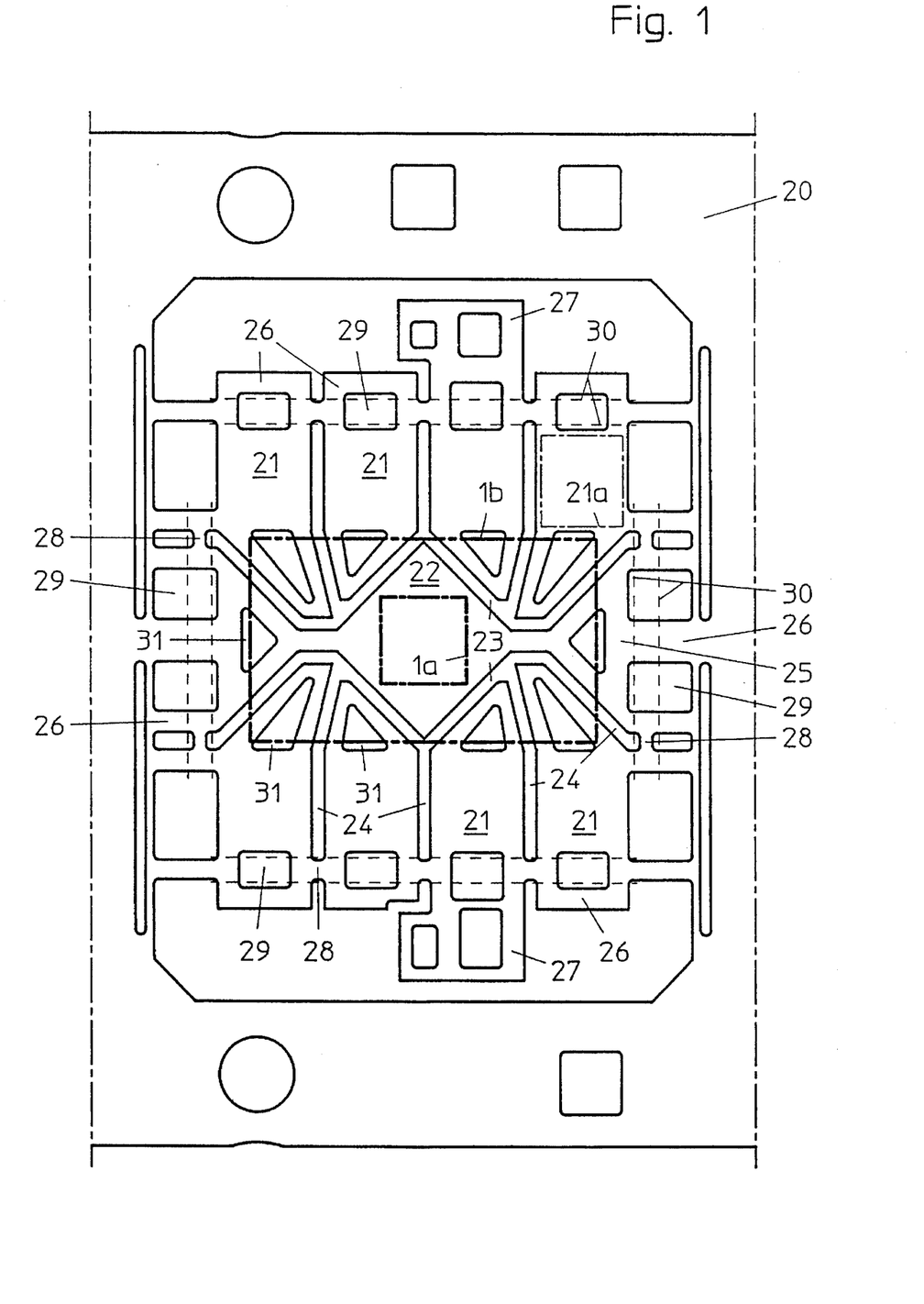
FIG. 1 shows a system support of the module in accordance with a first typical embodiment.

The following first describes details of the system support 20 by reference to FIG. 1, then follows a description of the manufacture and construction of the complete electronic module according to the first embodiment.

FIG. 1 is drawn at a very large scale and shows a section of a system support 20, also known as a lead frame, usually die-cut or punched out of thin, flat metal strip. Dot-dashed lines along both sides indicate further similar adjacent sections of the strip; in other words, a thin, flat sheet metal strip is die-cut or punched out in a known manner and consists of several sections identical to that shown in FIG. 1. Centrally of the system support 20 is a rectangular, preferably square, chip pad 22, limited by straight lines. Its boundaries are formed by slits 23, and the chip pad is held by bridges 25 on both sides. Several further slits 24 branch out from the slits 23, which together with other die-cut or punched cutouts form more or less rectangular areas 21 that serve as the external contacts of the finished electronic module. The present embodiment shows a module typical of those used in chip cards, which in accordance with current standards has a total of eight external contacts 21, i.e. two sets of four arranged in parallel rows. To show this more clearly, a dot-dashed line in FIG. 1 outlines the contact area 21a on one such external contact.

In the present example there are perforations 31 in the contacts 21 and in the bridges 25 in the areas adjacent to the chip pad 22. Further out, window-like perforations 29 are provided in each of the external contacts 21 and in the two bridges 25. More or less in line with these perforations, the contacts 21 and the bridges 25 are connected to one another by webs 28 at the ends of the slits 24. The bridges 25 and the contacts 21 extend further to form lugs 26, 27 that project beyond the webs 28. Finally, pairs of dashed parallel lines 30 roughly describe a rectangle in FIG. 1, in the region of the webs 28 and the so-called windows 29, and indicate the lines along which the extension lugs 26 and 27 are later bent over. The importance of the details of the system support 20 referred to in this paragraph is described in greater detail below in connection with the manufacture of the module and its integration in a moulded object.

The chip pad 22 is made to receive a semiconductor chip whose integrated circuitry is electrically connected to the external contacts 21 in a well-known manner. In FIG. 1, a thick dot-dashed line shows two possible sizes and positions of such chips: 1a indicates a square chip that fits completely within the area of the chip pad 22; but much larger chips can also be mounted, which may project well beyond the pad 22 and overlap adjacent parts of the external contacts 21; 1b indicates the outline of such a larger, rectangular chip, of a size and shape that may be regarded as about the maximum possible for the example shown.

Of special importance is the fact that the slits 23 which form the boundaries of the chip pad 22 lie at an angle to the edges of the square or rectangular chip 1, preferably, as shown, the oblique angle is about 45°. It is of further advantage if at least some of the slits 24 that extend from the slits 23 are "doglegged", i.e. extend along bent lines as shown, so that they are also oriented at least partly at an angle to the edges of the chip, particularly within the outline of the chip format 1b. In the thin metal structure of the system support 20, the aforesaid slits 23, 24 inevitably form lines of weakness. On the other hand, any fracture due to bending stresses in the monocrystalline material (usually silicon) of which chips are made, almost always occurs parallel to the edges of the chip. The shaping of the lead frame and alignment of the chip on the chip pad, respectively, as described above, ensure that the lines of weakness in the supporting metal structure are not parallel with the probable fracture lines in the chip; this greatly reduces the risk of fracture of the chip which is mechanically bonded into the module.

In the present example the layout and arrangement are such that the diagonals of the square chip pad 22 are parallel and at right angles to the two rows of external contacts 21; without any change in the alignment of the diagonals, the chip pad could also be rhomboid in shape. However, for example where the external contacts are arranged differently, a so-called in- "inverse" layout would also be feasible, i.e. one in which a square or rectangular chip pad is parallel to the main axes of the system support 20 and the chip is mounted at an angle thereto. The lines formed by the slits 24 that separate the contacts 21 can also be varied, so that the desired effect achieved is greater or less, depending on the lengths of slit extending obliquely to the chip, especially in the areas where the chip itself overlaps.

Figure 2:
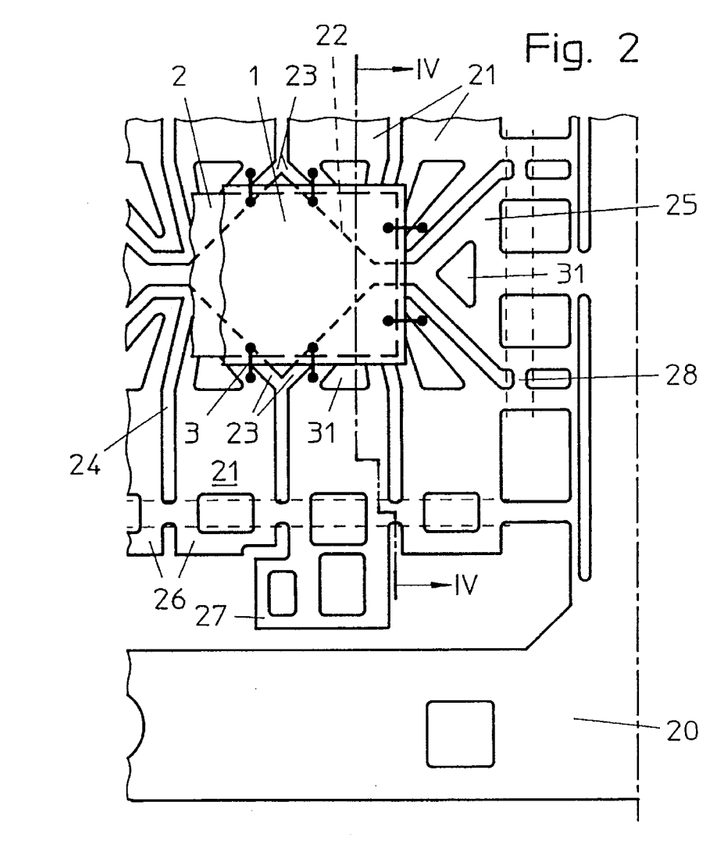
FIGS. 2 and 3 are part details of consecutive stages of manufacture of the electronic module, based on the system support shown in FIG. 1.

The main stages in the manufacture of the electronic module are described below, by reference to FIGS. 2, 3, and 4, and based on the system support 20 shown in FIG. 1. FIG. 2 shows a rectangular semiconductor chip 1 mounted on the system support's pad 22. Though this chip 1 is somewhat smaller than the maximum possible size 1b indicated in FIG. 1, it projects considerably beyond the chip pad 22 and overlaps adjacent parts of the external contacts 21. Wire connections 3 from the chip's semiconductor circuit to the external contacts 21 are made in a known manner. Insulating adhesive film 2 is preferably used to attach the chip to the metal-plate structure of the system support 20 to ensure its mechanical bond thereto. In the present case the film 2 is about the same size and shape as the chip and is made of heat-resistant synthetic resin, such as polyimide or polyester, with an adhesive coating that polymerizes when heated. Such a film 2 used for fitting of the chip 1 has the advantage that it can compensate a large range of thermal expansion as between the metal system support and the chip material, and also protects the chip by its ability to absorb shocks that act upon the system support. In addition, the film 2 insulates the chip electrically from the external contacts 21. Assembly and the wire connections 3 from the chip 1 to the external contacts are effected by proven, fully automated high-performance assembly equipment, such as that widely used for the assembly of semiconductors on system supports (such as lead frames or other substrates).

Figure 4:
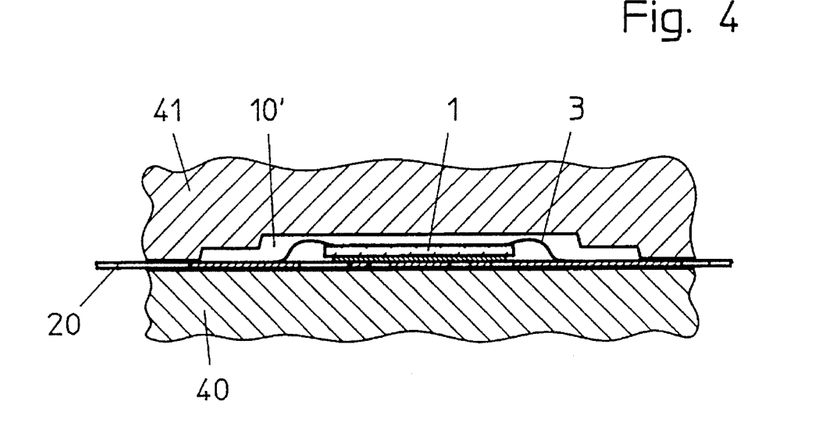
FIG. 4 is a diagrammatic section along line IV—IV in FIG. 2, and shows an injection mould in which an intermediate product in accordance with FIG. 2 has been inserted for the manufacture of the plastic casing.

After assembly as shown in FIG. 2, the assembled system support 20 is placed in an injection mould for the manufacture of a thin, flat plastic casing, as FIG. 4 diagrammatically shows; this should preferably be a multiple mould that can accommodate several modules at a time. The entire free surface of the flat system support 20 lies in close contact with the practically flat surface of the mould's bottom half 40, and the top half 41 of the mould forms a void 10'. Plastic material is then injected into this void 10' and pressed around the chip 1 and between parts of the system support 20, to form the outer shape of the casing 10.

Figure 3:
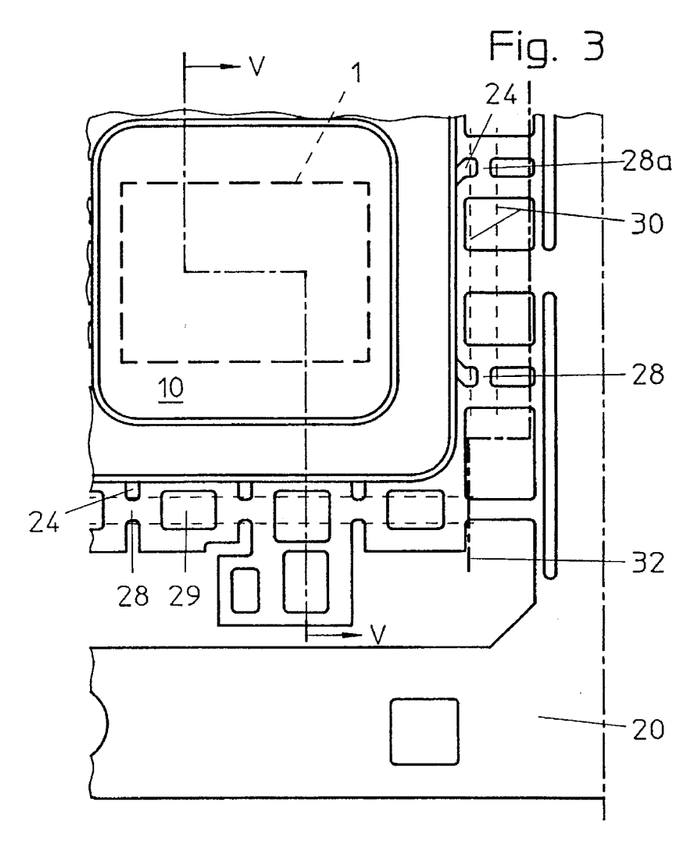

FIG. 3 shows the finished shape of the intermediate product and its casing 10. Injection moulding has filled with plastic material all the slits 23 and 24 as far as the webs 28, including all perforations 31 shown in FIG. 1. The plastic material finishes everywhere flush with the outer face of the system support 20 which was supported on the bottom half 40 of the mould, as FIG. 4 shows; this also particularly applies to the cross-sections of all the perforations 31. The plastic material of the casing 10 and the outside face of the system support's contacts 21 thus jointly form one side of the electronic module, namely its flat surface 12 (FIG. 5).

The plastic material for the casing 10 should preferably be a duroplastic synthetic resin having a low coefficient of thermal expansion, such as is generally known and used for embedding silicon chips, i.e. so-called low-stress material which contains a large proportion of quartz. By contrast, the metal used for the system support 20 has a high coefficient of thermal expansion, and therefore expands in the mould because of the temperature of the injected plastic. Later, as the metal cools, it shrinks again and encloses the plastic that fills the perforations 31 as it hardens, and thus produces a very strong compression fit of high density. This results in a mechanically stable bond between the metal parts and the resin of the casing, yet does not require the plastic resin to spread beyond the metal parts during injection moulding, nor the metal to be deformed or machined in its thickness.

Figure 5:
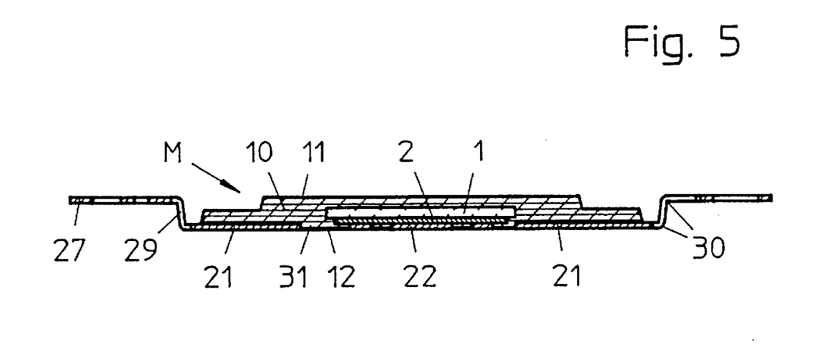
FIG. 5 is a section along line V—V in FIG. 3, and shows a finished module cut free from the system support and further deformed.
Figure 6:
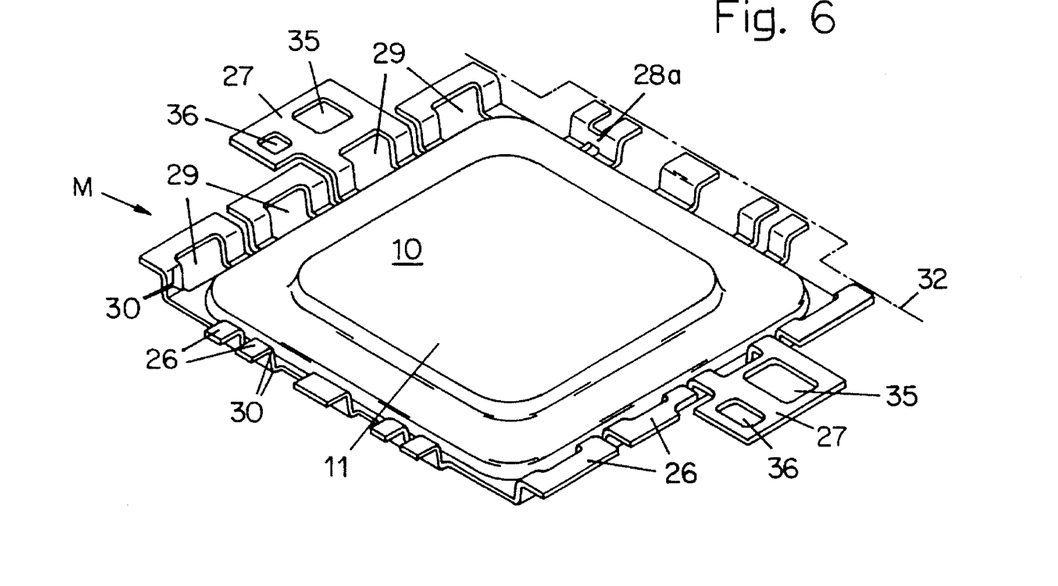
FIG. 6 is a perspective view of the electronic module in accordance with the first embodiment.

The profile of the thin, flat plastic casing 10 may be stepped in thickness, for example as indicated in FIGS. 4 to 6, in which only the central area of the casing is the full thickness, where the plastic material envelops the chip 1 and wires 3 to form the casing's flat side 11 opposite the external contacts 21 and the flat side 12.

Once the plastic casing 10 is formed, as shown in figure 3, the intermediate product taken from the mould is then further processed as follows:

First of all, the module is cut free from the framework of the system support 20, along two symmetrical lines 32, only one of which is visible in FIG. 3. At the same time, the webs 28 are punched out, except for a single web 28*a* (FIGS. 3 and 6) which provides an electrical connection from the chip pad 22, via the bridge 25, to the external contact at top right in FIG. 1, and forms the ground connection for the module's circuitry. With the electronic module in this state, it is now suitable for electrical tests by means of its external contacts. In the present case, where the module is to be integrated in a thin, flat plastic supporting body or medium, such as a chip card of credit-card shape and size, the metal lugs 26 and 27 are cranked or bent over all round the casing 10 along the bending lines 30, as indicated in FIGS. 5 and 6. These bent-over portions extend toward the side 11 of the module opposite to the system support; in the present example they extend for the full thickness of the module M, so that the ends of the lugs lie in the plane of the flat surface 11 of the casing opposite to that of the external contacts 21. Some of the lugs 26 and the two lugs 27 that lie opposite each other relative to the casing 10 are connected mechanically to the external contacts 21, and the other lugs 26 project from the two bridges 25 connected to the chip pad, as shown in FIG. 1. The perforations or windows 29 referred to above in connection with FIG. 1 are now in the zone where the lugs are bent over, as shown in FIGS. 5 and 6.

Figure 7:
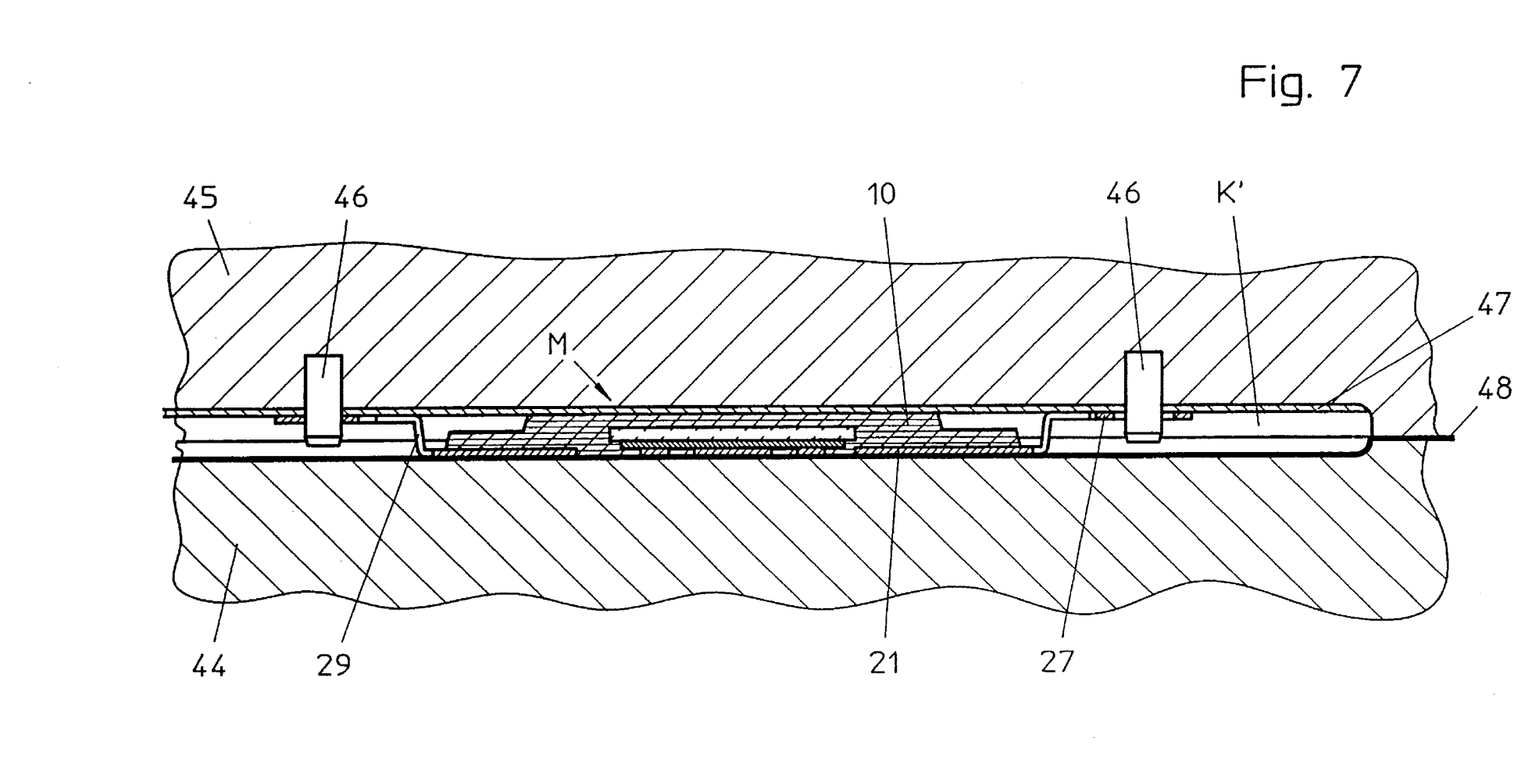
FIG. 7 is a section at a somewhat larger scale and shows a module placed in a further injection mould in which the module is embedded for the manufacture of a chip card.

The finished electronic module M shown in FIGS. 5 and 6 is now ready for insertion in an injection mould made up of two halves 44 and 45, as shown in FIG. 7. At the ends of the two lugs 27, suitable openings 35 are provided which can be gripped by the grippers of an assembly robot. Next to these are centering holes 36 in which centering pins 46 of the injection mould engage, as shown in FIG. 7, to ensure that the module M is accurately positioned for the chip card in the mould's void K'. Note that this positioning process is performed directly on the module's external contacts and not indirectly by way of the module's casing.

Generally, the lugs 27 of the system support 20 that project beyond the plastic casing 10 are designed to interact with automated assembly equipment used for handling the modules M. The gripper and/or positioning profiles 35, 36 of the module's metal structure, for example shaped like those shown, lie in a precise positional relationship to the module's external contacts 21. This also ensures precise automated manipulation and accurate positioning of the modules, for example in test operation, packaging, etc. Use of a metal rather than a plastic structure and the relatively large offset between the profiles 35, 36 of the two lugs both ensure this high positioning accuracy.

A thin decorative film 48 can be laid in the injection mould 44, 45, as shown in FIG. 7, against which the electronic module M then lies with its flat face 12 and external contacts. The film used for this is usually printed in such a manner as to be suitable for a thermal transfer printing process, in which the printed image combines only with the plastic injected in the void K' of the mould, but not with the metal parts of the electronic module. The film 48 is used to obtain a printed image on the face of the chip card by wellknown means. In the upper half of the mould 45 a label 47 covers the electronic module M. This is also printed and extends over the whole of the chip card format. For making the chip card, injection of thermoplastic material, preferably ABS, into the void K' of the mould also uses techniques known per se. In this process, the plastic material is injected all round the edges of the module M, which becomes perfectly flush with the injected material of the card; the thermoplastic material passes through the windows 29 and laterally between all the lugs 26, 27, and thus forms an extremely solid mechanical bond between the module's metal parts, especially its external contacts, and the material of the card. It is note-worthy however that no thermoplastic material is used as a backing on either face of the module, i.e. the electronic module is of the same thickness as the thermoplastic material of which the card is made. In other words, the full thickness of the injected card material is available for the module casing 10; thus, for a given card thickness if 0.84 mm and a thickness of, say, 0.12 mm for the label 47, the module casing 10 can be 0.72 mm thick.

The electronic module described above and other suitable embodiments thereof are also recommended for integration in other thin, flat plastic objects or supporting bodies, such as electronic keys. Generally, however, various other forms of integration and use are also possible, i.e. wherever a thin, flat type of module is necessary or offers special advantages, as for example in the assembly of components on printed circuit boards by the SMD (surface mounted device) technique.

FIGS. 8 to 13 show a further embodiment of an electronic module of extra-thin construction and of its manufacture. In this case, injection moulding of the module's casing and its integration in a card or other supporting body are similar as described above and not shown separately; cf. FIGS. 4 to 7 and the related description set forth above. Many of the module's components in the embodiment of FIGS. 8 to 13 are similar to those in the embodiment described above and thus have the same reference numbers.

Figure 8:
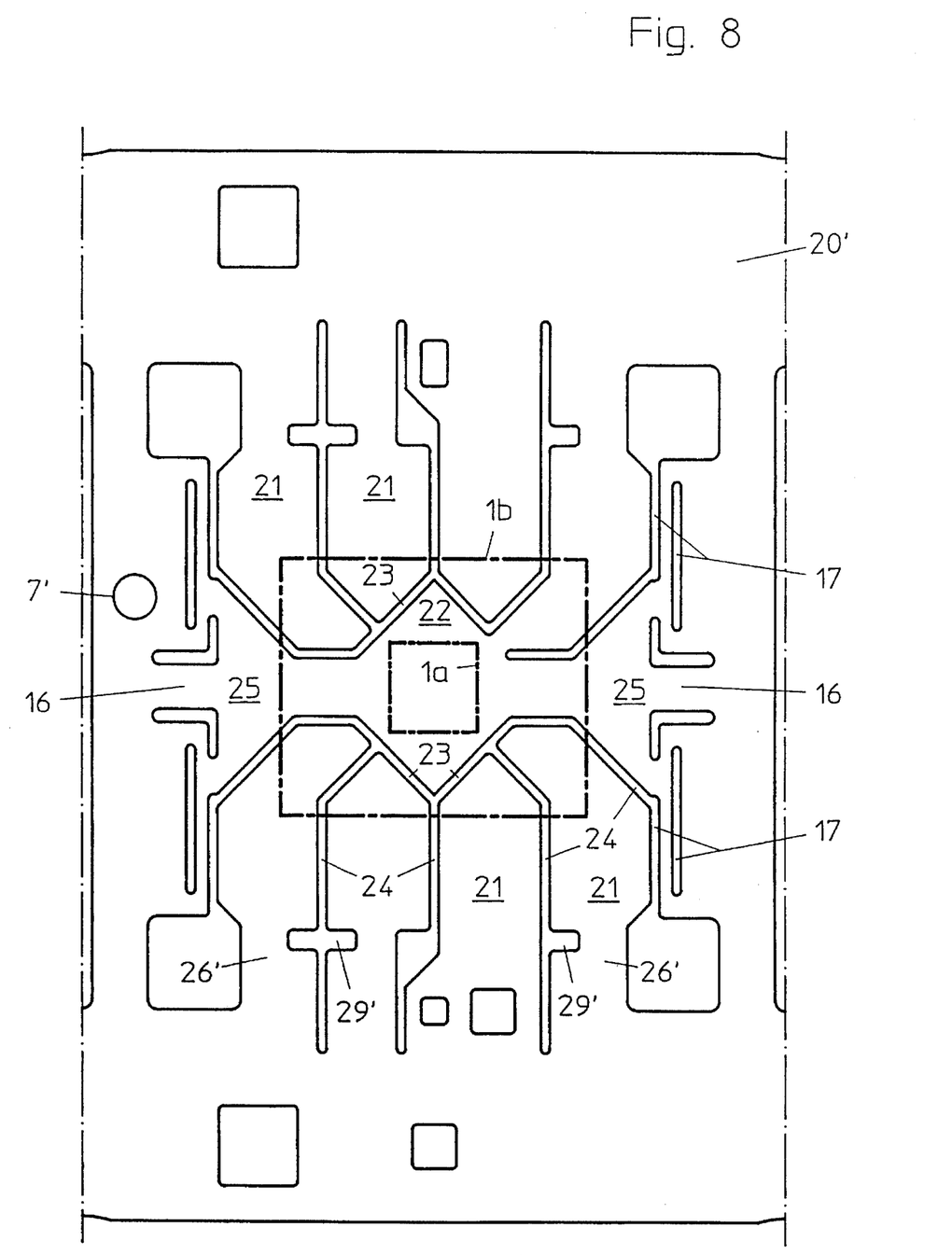
FIG. 8 is similar to FIG. 1 but shows another type of system support, in accordance with a second embodiment.
Figure 10:
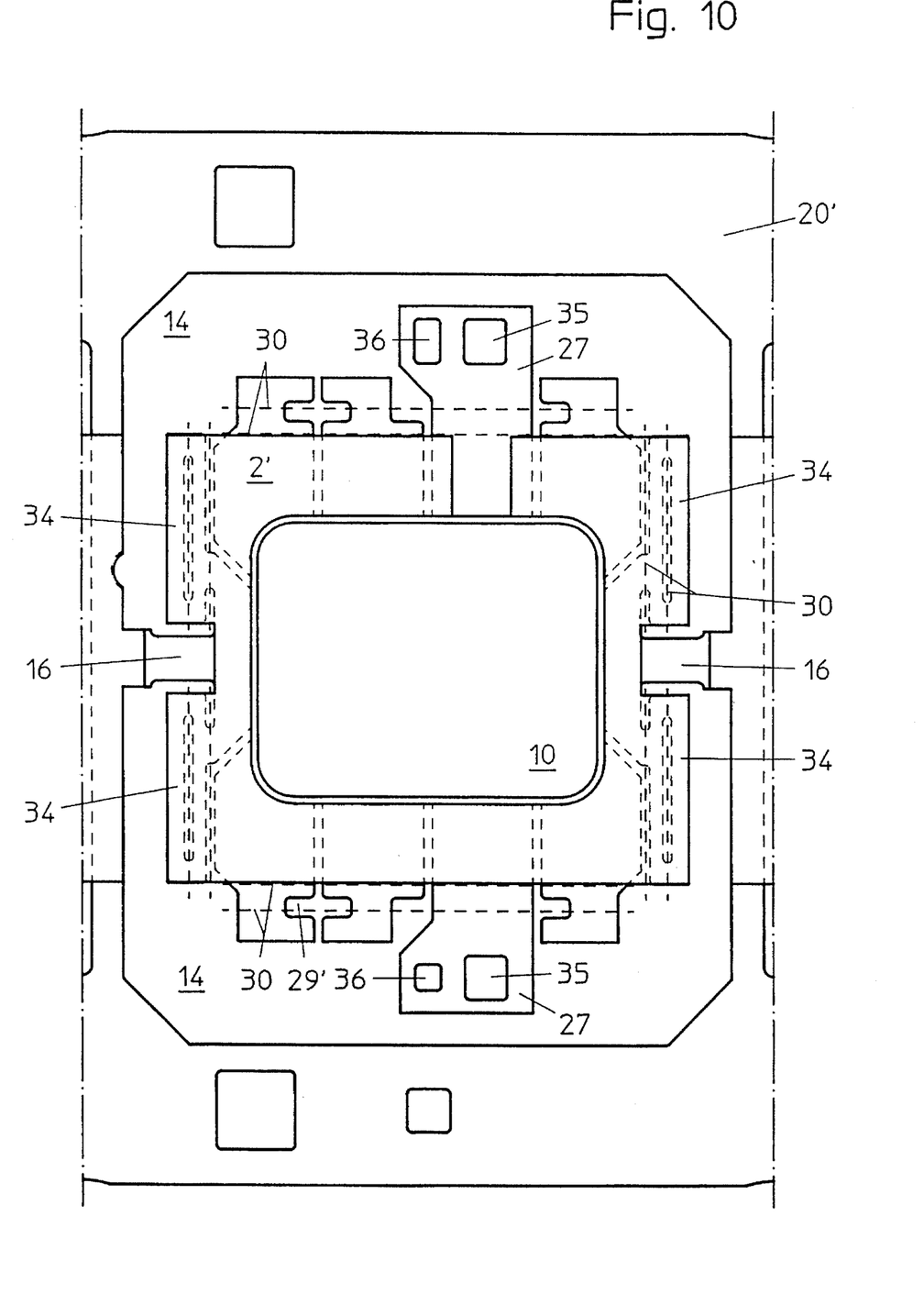
Figure 11:
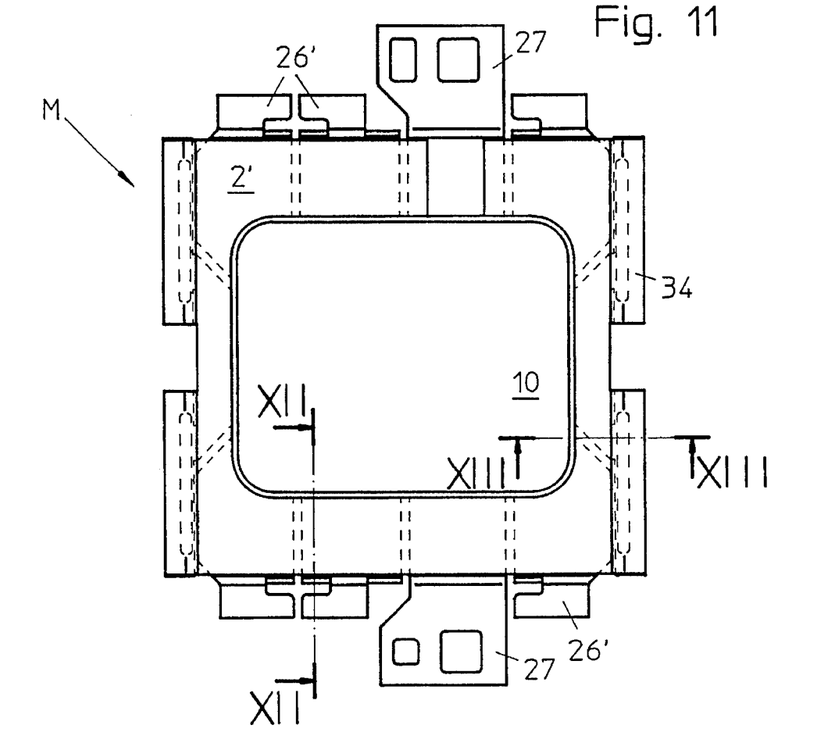
FIG. 11 is a plan view of the finished module according to the second embodiment.
Figure 12:
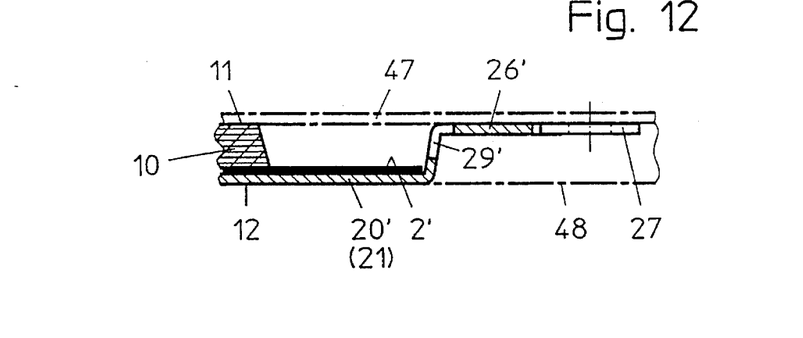
FIG. 12 is a larger-scale section along line XII—XII in FIG. 11.

The following differences apply to the system support 20' in FIG. 8: On the external contacts 21, the portions remote from the chip pad 22 are not connected to one another by webs, as items 28 in FIG. 1, but extend separately into the lateral margins of the system support 20'. The contacts 21 have no perforations such as 31 and 29; instead, lateral cutouts 29' are provided which lie on bending lines 30, as FIG. 10 indicates. On the bridges 25 that hold the chip pad 22, webs 16 connect the outlying portions to the system support, and slits 17 are provided on both sides of the webs 16; these slits 17 are parallel to each other and to the contacts 21, and lie on further bending lines 30, as seen in FIG. 10.

Figure 9:
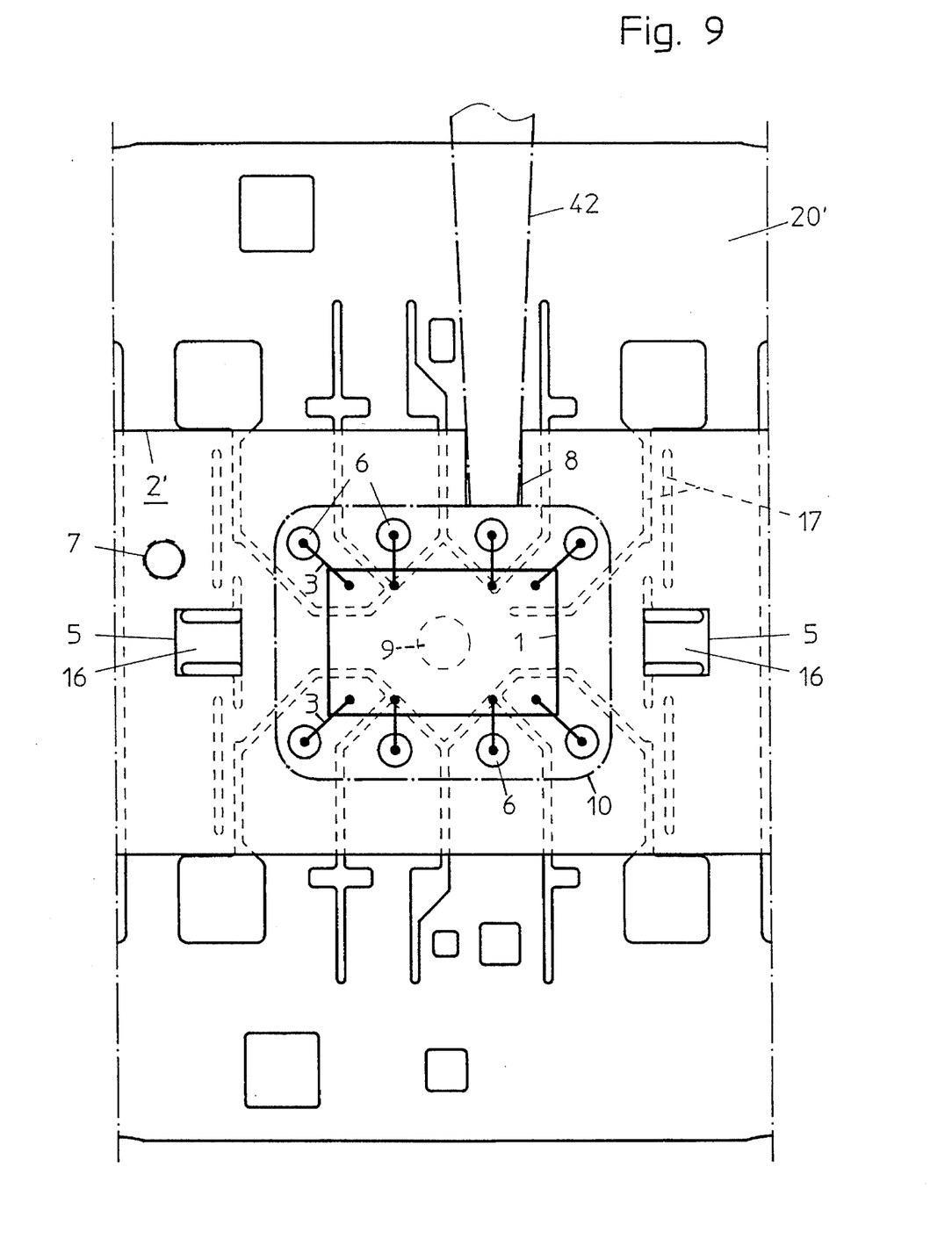
FIGS. 9 and 10 are similar to FIGS. 2 and 3, and show the corresponding subsequent stages of manufacture of the second embodiment.

FIG. 9 shows the chip 1 mounted on the system support 20' and connected electrically by leads 3 to the external contacts 21. Chip 1 is again attached to the system support 20' by an insulating bonding film 2' that lies between them, but in this embodiment the film 2' extends beyond the area of the chip 1 as far as over the contacts 21, bridges 25, and slits 17. In particular, the film also covers all the slits 23 and 24 that form the boundaries of the chip pad and of the external contacts. The film 2' is typically made of tape material, such as polyimide, for example 50 μm thick Kapton or Mylar, and has holes die-cut or punched out before it is applied to the system support 20', as follows:

two openings 5 that leave the webs 16 exposed;

openings 6 for the passage of the wires 3 to the external contacts;

a centering hole 7 which is brought into coincidence with a corresponding hole 7', as shown in FIG. 8;

an edge cut-out in the area of the sprue or stalk 42 that occurs in injection moulding of the module casing 10; FIG. 9 shows 42 and 10 dot-dashed;

if necessary, a hole 9 may be left in the area of the chip pad for connecting the underside of the chip to the system support by means of a conductive adhesive.

The thus prepared section of film 2' may be laminated to the system support 20', as described above for the adhesive film 2 in connection with FIG. 2. The chip 1 is then bonded to the adhesive film and the electrical connections are made, all similarly as described above.

In the present embodiment, the film 2' not only provides an elastic mechanical bond between chip and system support, but also has other functions: the adhesive film provides an intimate, large-surface connection between the adjacent contacts 21, the chip pad 22, and the bridges 25. In injection moulding of the casing 10 in a mould similar to that described and shown in FIG. 4, the film 2' stops the plastic material penetrating into the slits 23, 24 and under the external contacts 21 on the module's outer surface, i.e. it prevents the unwanted formation of so-called flashes on the outer surface. A film material and/or adhesive coating used with some but slight electrical conductivity may be used for the effective attenuation of voltage peaks, for example due to electrostatic discharges that reach the external contacts, to provide so-called ESD protection (ESD=electrostatic discharge); this is especially important in the case of chip cards, because the terminals of the integrated circuit, i.e. the external contacts, are exposed on the outside of the chip card and are insulated from one another. A further important function of the film 2' in the area of the slits 17 is explained below in connection with FIGS. 11 and 13.

In this second embodiment, the film 2' provides practically the only, though indirect mechanical link between the casing 10 and the system support 20'. Experience has shown that adhesion of the casing's plastic on the film 2', and of the film on the system support, is far greater than direct adhesion between the materials of the casing and of the system support. Hence the adhesive film 2' considerably strengthens the module M, and, in particular, it effectively prevents the external contacts becoming loose or pulled out from the chip card's surface. Conversely, after injection moulding of the casing 10, the sprue or stalk 42, which forms directly on the metallic surface of the system support, is easy to remove from its metal substrate and to break off at the edge of the casing.

FIG. 10 indicates that when the module has been taken out of the injection mould for making the casing 10, and after removal of the sprue or stalk, two symmetrical surfaces 14 are punched out from the system support 20', while the module is still held by its two webs 16. This cutting-free operation severs the contacts 21 on the outside, but they still remain attached to the casing 10 via the adhesive film 2'. The profiles of the lugs 27 are shaped in the same punching process, and a hole 35 can be punched out at the same time in the upper lug 27, the sprue or stalk 42 having been removed. In the same operation, four lugs 34 are also punched out on both sides of the two webs 16 near the slits 17.

In a next step, a bending tool bends over the projecting portions of the system support's metal strip, along the bending lines 30 on the edges of the module, whereby the webs 16 are left flat and hold the module attached to the system support. Finally, a further punching tool also trims off the webs 16 and thus releases the finished module M from the system support 20'.

The modules M made in the fully automated manner as described above and shown in FIGS. 11 to 13 can then be integrated in a chip card or other support by an injection-moulding technique similar to that described earlier by reference to FIG. 7 for the first embodiment. As regards reliability of fixation etc, essentially the same characteristics and features are obtained. The plastic material of the supporting object is likewise injected around the edges of the casing 10 and bonds to the flat surface surrounding the module casing 10, which is covered by the film 2', and likewise to the bent-over portions 26', 27, and 34, as will be easily recognized from FIGS. 11 to 13.

Figure 13:
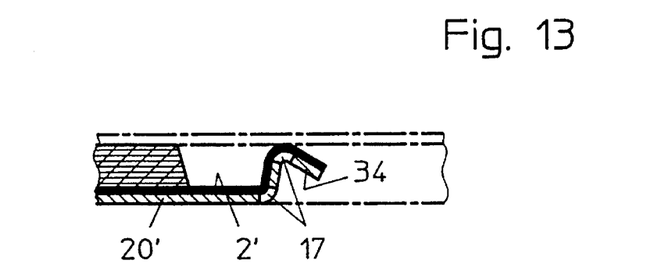
FIG. 13 is a corresponding section along line XIII—XIII in FIG. 11.

Finally, FIG. 13 shows the additional function of the film 2' which is drawn across the slits 17, as brief reference has already been made. During injection moulding of a supporting body or object, such as a chip card, the plastic material penetrates into the slits 17 but remains separate along the slits due to the film 2'. This provides a useful hinge effect along the slits 17 that can to a large extent cope with the stresses produced when the card is bent, and thus further protects the module M and the chip 1 from damage due to excessive bending of the card. It would also be feasible, if necessary, to use the same means in respect of the lugs 26' and 27, i.e. by providing further slits in that areas and extending the film 2' past these lugs and the zones where they are bent over. In the case of chip cards, however, because of the established standard layout of the module M within the rectangular card format, the bond between the lugs 34 and the card's material is subjected to far greater bending stresses than the corresponding bond at lugs 26', 27.

I claim:

1. Electronic module of thin construction, having external contacts which lie in a plane on a flat side of a plastic casing and which are made out of a system support having rectangular edges formed of a thin, flat metal-strip structure, and having a rectangular semiconductor chip mounted on one side of the system support on a chip pad thereof, said chip being moulded within plastic material of the casing and connected to the external contacts, characterized in that a plurality of slits in the system support form the boundaries of said chip pad and separate the chip pad from said external contacts; and the slits are situated at an angle, of about 45°, relative to the edges of the chip and relative to said system support rectangular edges, said slit plurality further dividing said chip pad into a central pad region flanked by at least one opposed outer pad region, with said central pad region having a boundary substantially orthogonal to an adjacent outer pad region boundary.

2. Electronic module according to claim 1, having two parallel rows of said external contacts arranged on opposite sides of the chip pad, characterized in that the central pad region is essentially square and is arranged with its diagonals at a right angle and parallel respectively to the said rows of contacts.

3. Electronic module according to claim 1, characterized in that another set of slits separate the external contacts and extend from said one set of slits which form the boundaries of the chip pad, and at least partly extend along bent lines.

4. Electronic module according to claim 1, characterized in that said external contacts in areas adjacent to the chip pad and said outer pad region, both have perforations filled with plastic material of the moulded casing, and said plastic material within the cross-section of the perforations being flush with an outer face of said contacts.

5. Electronic module according to claim 1, characterized in that the semiconductor chip is bonded to the central pad region by an insulating adhesive film.

6. Electronic module according to claim 5, characterized in that the semiconductor chip extends laterally beyond the central pad region and also adheres to adjacent parts of the external contacts by means of the adhesive insulating film.

7. Electronic module according to claim 5, characterized in that the adhesive film extends continuously over said external contacts and is bonded thereto virtually over the entire area of the contacts.

8. Electronic module according to claim 1, characterized in that the semiconductor chip is bonded to the chip pad by an adhesive film which is electrically conductive.

9. Electronic module according to claim 1, being integrally moulded into a thin, flat plastic object that extends flush with the plastic casing of the module, characterized in that said system support forms lugs that lie outside the edge of said casing and are bent over or cranked toward a flat side of the casing.

10. Electronic module according to claim 9, characterized in that at least some of the aforesaid lugs have perforations or cutouts in the zones where the lugs are bent over.

11. Electronic module according to claims 10, characterized in that an adhesive film bonds the semiconductor chip to the chip pad and extends over at least part of said lugs in the area of their perforations or cutouts.

12. Electronic module according to claim 9, characterized in that at least some of said lugs are connected mechanically to the external contacts.

13. Electronic module according to claim 9, characterized in that two lugs that lie opposite each other with respect to the casing have centering holes adjacent to their ends, said centering holes being for the engagement by centering organs of an injection mould that accommodates the module.

14. A thin, flat plastic object, comprising a casing of molded plastic material having a thin flat configuration having a thickness with a molded-in electronic module (M) also having a thin flat construction of equal thickness and formed by a flat, rectangular semiconductor chip mounted on a chip pad portion of a flat metal strip and enclosed within said casing, the metal strip forming external contacts for the chip within the casing and having slits that form boundaries of the chip pad and extend at oblique angles to the mounted chip, said slits further dividing said chip pad into a central pad region flanked by at least one opposed outer pad region, with said central pad region having a boundary substantially orthogonal to an adjacent outer pad region boundary, said external contacts lying in a plane on a flat side of said plastic casing, the metal strip also forming bent over mounting lugs, said casing plastic material being limited to the portion of said module adjacent said external contact plane that contains said chip.

15. The electronic module of claim 1 further comprising external contacts bonded to said plastic casing, said system support having lugs outside the plastic casing, which are formed with gripper profiles arranged in registration with the external contacts of the module, said casing plastic material being limited to the portion of said module adjacent said external contact plane that contains said chip.

16. Electronic module according to claim 15, characterized by two lugs which each project beyond one of two opposite edges of the flat plastic casing.

17. Electronic module according to claim 15, characterized in that each of the lugs extends outward from one of the external contacts, is bent over or cranked outside the plastic casing over the thickness thereof, and whose end extends to the plane of a flat surface of the casing opposite the plane of the external contacts.

18. Electronic module of thin construction, having external contacts which lie in a plane on a flat side of a plastic casing and which are made out of a system support having rectangular edges formed of a thin, flat metal-strip structure, and having a rectangular semiconductor chip mounted on one side of the system support on a chip pad thereof, said chip being moulded within plastic material of the casing and connected to the external contacts, characterized in that a plurality of slits in the system support form the boundaries of said chip pad and separate the chip pad from said external contacts; and the slits situated at an angle, of about 45°, relative to the edges of the chip and relative to said system support rectangular edges, said casing plastic material being limited to the portion of said module adjacent said external contact plane that contains said chip, said slit plurality further dividing said chip pad into a central pad region flanked by at least one opposed outer pad region, with said central pad region having a boundary substantially orthogonal to an adjacent outer pad region boundary.

19. The module of claim 18 wherein said plastic material has a thickness of less than 0.9 mm.

20. Electronic module of thin construction, having external contacts which lie in a plane on a flat side of a plastic casing and which are made out of a system support having rectangular edges formed of a thin, flat metal-strip structure, and having a rectangular semiconductor chip mounted on one side of the system support on a chip pad thereof, said chip being moulded within plastic material of the casing and connected to the external contacts, characterized in that a plurality of slits in the system support form the boundaries of said chip pad and separate the chip pad from said external contacts; and the slits situated at an angle, of about 45°, relative to the edges of the chip and relative to said system support rectangular edges, said external contacts each having a contact end formed by said slits, said module having no more than a portion of each of said contacts, including said contact end, extending under a portion of said chip, said slit plurality further dividing said chip pad into a central pad region flanked by at least one opposed outer pad region, with said central pad region having a boundary substantially orthogonal to an adjacent outer pad region boundary.

* * * * *